United States Patent [19]

Kuo

[11] 4,408,306

[45] Oct. 4, 1983

[54] COLUMN AND ROW ERASABLE EEPROM

[75] Inventor: Clinton C. K. Kuo, Austin, Tex.

[73] Assignee: Motorola, Inc., Schaumburg, Ill.

[21] Appl. No.: 306,120

[22] Filed: Sep. 28, 1981

[51] Int. Cl.³ ............................................. G11C 11/40
[52] U.S. Cl. .................................... 365/218; 365/189; 365/230
[58] Field of Search ......................... 365/189, 218, 230

[56] References Cited

U.S. PATENT DOCUMENTS 4,172,291 10/1979 Owens et al. ....................... 365/218
4,279,024 7/1981 Schrenk ............................... 365/218

Primary Examiner—Terrell W. Fears
Attorney, Agent, or Firm—Anthony J. Sarli, Jr.; Jeffrey Van Myers; James L. Clingan, Jr.

[57] ABSTRACT

An EEPROM has an array of memory elements arranged by row and column which is accessed by a decoder capable of selecting all columns while enabling a single row in response to one input and selecting one column while enabling all rows in response to another input, thereby selectively erasing one entire row or column.

4 Claims, 21 Drawing Figures

COLUMN AND ROW ERASABLE EEPROM

CROSS-REFERENCE TO RELATED APPLICATIONS

Related subject matter is disclosed in the following related applications filed simultaneously herewith and assigned to the assignee hereof:
1. U.S. patent application No. SC 305,830 entitled "Memory with Permanent Array Division Capability"
2. U.S. patent application No. 306,119 entitled "EEPROM With Bulk Zero Program Capability."

Related subject matter is also disclosed in related U.S. Application No. 342,040 entitled "Sense Amplifier," filed Jan. 25, 1982, and assigned to the assignee hereof.

TECHNICAL FIELD

The invention relates to electrical erasable programmable read only memeories (EEPROMS), and more particularly to an EEPROM capable of selectively erasing columns and rows of memory elements therein.

PRIOR ART STATEMENT

In general, each word location in an EEPROM must be erased before it can be programmed. EEPROMS currently have the capability of selectively erasing an entire array or a single word. The array erase mode is best suited for the situation in which the entire array is to be reprogrammed. In this mode, the entire array is simultaneously erased and thereafter re-programmed one word location at a time. On the other hand, the word erase mode is best suited for the situation in which only selected word locations are to be reprogrammed. In this mode, the selected word locations are erased one at a time, and then re-programmed one at a time. There is a difficulty, however, when a significant number, but still less than the entire array of word locations are to be reprogrammed. If the entire array is erased, then of course the entire array must be reprogrammed even though only a portion needed to be changed. Conversely, if only those word locations requiring change are erased, to save on re-programming operations, additional erasing operations are required because the word locations must be erased one at a time.

A cell array similar to that disclosed herein is disclosed in U.S. Pat. No. 4,266,283 entitled "Electrically Alterable Read-Mostly Memory." There is no suggestion, however, of erasing by row or by column.

SUMMARY OF THE INVENTION

An EEPROM having the capability of erasing an entire row or an entire column of memory elements in one operation is disclosed. The EEPROM has an array of electrically erasable memory elements arranged with one of said memory elements at the intersection of each of a plurality of rows and columns of said array. Column and row address signals determine which columns and rows, respectively, are selected. Input signals determine the mode of operation of the EEPROM. A logic circuit provides a row control signal and a column control signal, each having a logic state determined by the input signals. When the EEPROM is in an erase mode, a column select circuit will cause an erase signal to be coupled to the column which is selected by the column address signal when the column control signal is in a first logic state, whereas the column select circuit will cause the erase signal to be coupled to all of the columns when the column control signal is in a second logic state. Likewise, when the EEPROM is in an erase mode, a row decoder circuit will enable the row which is selected by the row address signal to receive the erase signal when the row control signal is in a first logic state, whereas the row decoder circuit will enable all of the rows to receive the erase signal when the row control signal is in a second logic state. Accordingly, when the column control signal is at the second logic state and the row control signal is at the first logic state, the erase signal is coupled to all of the columns so that the row which is selected by the row address signal is electrically erased. Similarly, when the column control signal is in the first logic state and the row control signal is the second logic state, all of the rows are enabled to receive the erase signal so that the column which is selelcted by the column address signal is electrically erased.

DESCRIPTION OF A PREFERRED EMBODIMENT

Figure 1:
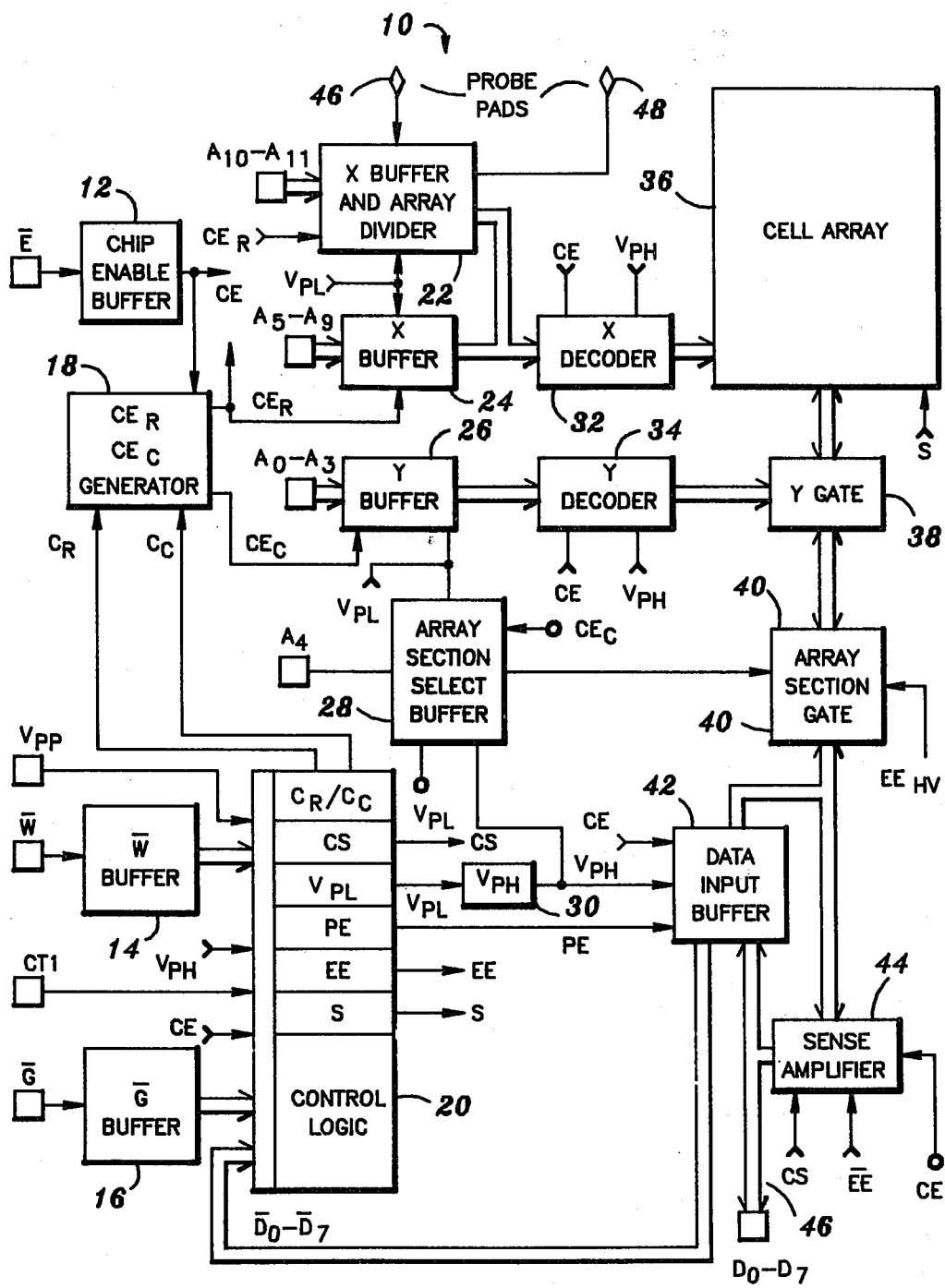
FIG. 1 is a block diagram of an EEPROM according to a preferred embodiment of the invention

Shown in block diagram form in FIG. 1 is an electrically erasable programmable read only memory (EEPROM) 10 constructed in accordance with the preferred embodiment of the present invention. In the illustrated form, EEPROM 10 is comprised generally of a chip enable (CE) buffer 12, a write enable (W) buffer 14, a chip select (G) buffer 16, a row enable/column enable signal ($CE_R/CE_C$) generator 18, control logic 20, an X buffer and array divider 22, an X buffer 24, a Y buffer 26, an array section select buffer 28, a high voltage control signal ($V_{PH}$) generator 30, an X decoder 32, a Y decoder 34, a cell array 36, a Y gate 38, an array section gate 40, a data input buffer 42, and a sense amplifier 44. In the illustrated form, cell array 36 is comprised of 32,768 bits arranged as 128 rows by 32 columns of 8-bit word locations for a total storage capacity of 4096 8-bit data words. In the preferred embodiment, each of the cells in the cell array 36 is initially erased to a logical one state. Thereafter, individual cells comprising particular words may be selectively programmed to a logical zero state. When desired, the cells may be again erased to the logical one state.

In the preferred embodiment, EEPROM 10 is capable of operating in any of the following modes: a standby mode, a read mode, a word program mode, a bulk zero program mode, first and second word erase modes, a column erase mode, a row erase mode, and an array erase mode. In general, the operating mode of EEPROM 10 is determined by one or more of the following input signals: a chip enable signal $\overline{E}$, a high voltage signal $V_{PP}$, a write enable signal $\overline{W}$, a bulk zero signal CT1, a chip select signal $\overline{G}$, row address signals $A_x$, column address signals $A_y$, and data signals $D_n$. In the illustrated form, column address signals $A_y$ are $A_0$–$A_4$, row address signals $A_x$ are $A_5$–$A_{11}$ and data signals $D_n$ are $D_0$–$D_7$. In response to the input signals, internal control signals are typically asserted as either active high or active low. For simplicity, however, the following functional description of the EEPROM 10 will describe the functions of the internal control signals without regard to whether the signals are actually active high or active low.

The EEPROM 10 will operate in the standby mode when $\overline{E}$ is high. In this mode, all other inputs are irrelevant. In response to $\overline{E}$ being high, chip enable buffer 12 negates internal chip enable signal CE to $CE_R/CE_C$ generator 18 indicating that EEPROM 10 is to be in the standby mode. $CE_R/CE_C$ generator 18 in turn negates a row enable signal $CE_R$ which disables X buffer and array divider 22 and X buffer 24. $CE_R/CE_C$ generator 18 also negates a column enable signal $CE_C$ which disables Y buffer 26 and array section select buffer 28. In response to negated internal chip enable signal CE, X decoder 32 keeps all of the rows disabled regardless of address input. In contrast, in response to negated internal chip enable signal CE and to signals provided by disabled Y buffer 26 and array section select buffer 28, all columns of words are selected. Y decoder 34, in response to signals provided by disabled Y buffer 26 and to negated internal control signal CE, asserts column decoder signals to Y gate 38, causing Y gate 38 to couple all columns of words to array section gate 40. Array section gate 40, in response to signals asserted by otherwise disabled array section select buffer 28, couples all of the columns of words to sense amplifier 44 for precharging. Also in response to negated internal chip enable signal CE, all outputs of sense amplifier 44 are disabled to establish a high impedance output on data I/O lines 46.

The EEPROM 10 will operate in the word program mode when $\overline{E}$ is low, $\overline{G}$ is high, $\overline{W}$ is low, CT1 is low or floating, and $V_{PP}$ is in a program state of the order of 20.0–22.0 volts. In the preferred form, cell array 36 has two sections comprising respective halves of the cell array 36. Y gate 38 has 2 sections, each of which couples a respective one of the sections of cell array 36 to a corresponding section of array section gate 40. In response to receiving address signals $A_0$–$A_3$ via Y buffer 26, Y decoder 34 asserts a column decoder signal to Y gate 38 to couple 2 columns of words, one from each section of cell array 36, to corresponding sections of array section gate 40. In response to address signal $A_4$, array section select buffer 28 asserts a buffered $A_4$ signal to array section gate 40 for coupling a particular one of the sections of Y gate 38 to data input buffer 42. In response to receiving address signals $A_5$–$A_{11}$ via X buffer 24 and X buffer and array divider 22, X decoder 32 asserts a row decoder signal to the cell array 36 to enable a particular row of words, i.e. the corresponding word location in each of the columns of words of cell array 36. Thus, an 8-bit data word comprising data signals $D_0$–$D_7$ is coupled via data input buffer 42 to each of the word locations in the selected column in cell array 36 but actually stored in only that particular word location in the selected column of words which is in the enabled row.

In the preferred form, data input buffer 42 levelshifts the voltage of the received data signals $D_0$–$D_7$ to a voltage sufficient to program cells in cell array 36. Accordingly, the row decoder signal, the column decoder signal, and the buffered $A_4$ signal are similarly level shifted to an appropriate level using a high voltage control signal $V_{PH}$ provided by $V_{PH}$ generator 30 to X decoder 32, Y decoder 34, and array section select buffer 28. $V_{PH}$ generator 30 provides high voltage control signal $V_{PH}$ in response to a high voltage logic signal $V_{PL}$ which is generated by control logic 20 in response to appropriate input signals.

The EEPROM 10 will operate in the read mode when $\overline{E}$ is low, $\overline{G}$ is low, $\overline{W}$ is high, and CT1 is low or floating. A data word stored in a particular word location is accessed by address inputs $A_0$–$A_{11}$ in a manner similar to that for accessing a word location when EEPROM 10 is in the word program mode, except that in the read mode the data word stored in the accessed word location is coupled from cell array 36 to sense amplifier 44 via Y gate 38 and array section gate 40. In response to receiving the accessed data word, sense amplifier 44 provides the accessed data word on data I/O line 46 as data signals $D_0$–$D_7$. In the read mode, a high voltage is not required on the row decoder, column decoder and the buffered $A_4$ signals. Accordingly, high voltage control signal $V_{PH}$ is not provided by $V_{PH}$ generator 30.

The EEPROM 10 will operate in the first word erase mode when $\overline{E}$ is low, $\overline{G}$ is high, $V_{PP}$ is in the program state and CT1 is low or floating. In addition, write enable signal $\overline{W}$ must be in a state which is higher than a normal logic high, for example 8.0–22.0 volts. In this mode, a particular word location is accessed by address inputs $A_0$–$A_{11}$ in a manner similar to that for accessing a word location when the EEPROM 10 is in the word program mode. One difference is that in the word program mode the 8-bits comprising a data word are coupled via respective bit-lines to corresponding cells at the accessed word location, whereas in the first word erase mode an erase signal $EE_{HV}$ generated by control logic 20 on a separate erase line is coupled to each of the cells at the accessed word location via array section gate 40 and Y gate 38 to erase all cells at the word location to a logic one. In response to a negated program enable signal PE which is generated by control logic 20, data input buffer 42 is disabled and presents a high impedance to array section gate 40.

The EEPROM 10 will operate in the second word erase mode when $\overline{E}$ is low, $\overline{G}$ is high, $\overline{W}$ is low, $V_{PP}$ is in the program state, and CT1 is low or floating. In addition, the data signals $D_0$–$D_7$ must all be high. In this mode, the data input buffer 42 couples the data signals $D_0$–$D_7$ to the control logic 20 where the all-high condition of data signals $D_0$–$D_7$ is detected. In response to the all high condition of data signals $D_0$–$D_7$ and to the other input signals, control logic 20 provides the $EE_{HV}$ signal. Thereafter, the addressed word is erased in the same manner as in the first word erase mode.

The EEPROM 10 will operate in the column erase mode when $\overline{E}$ is low, $\overline{G}$ is higher than a normal logic high, $\overline{W}$ is high, $V_{PP}$ is in the program state, and CT1 is low or floating. In this mode, the column of words to be erased is selected via address signals $A_0$–$A_4$ in the same way as a column of words is selected in the word erase modes. However, instead of only one row being enabled, all of the rows are enabled by X decoder 32 so that all of the word locations in the selected column of words receive the erase signal $EE_{HV}$. In particular, X buffer 24 and X buffer and array divider 22 are disabled from responding to address signals $A_5$–$A_{11}$ and forced to provide steady state signals which cause X decoder 32 to select all of the rows, in response to negated row enable signal $CE_R$ provided by $CE_R/CE_C$ generator 18 in response to a negated row control signal $C_R$ generated by control logic 20.

The EEPROM 10 will operate in the row erase mode when $\overline{E}$ is low, $\overline{G}$ is higher than a normal logic high, $\overline{W}$ is higher than a logic high, $V_{PP}$ is in the program state, and CT1 is low or floating. In this mode, the single row to be erased is enabled in response to address signals $A_5$–$A_{11}$ in the same manner as a row is enabled in the word erase modes. However, in this mode all of the columns of words are simultaneously selected as in the standby mode, so that the erase signal $EE_{HV}$ is coupled to all of the word locations of the enabled row. One difference is that in the standby mode all bit-lines, 8-bit lines per column of words, are coupled to sense amplifier 44 for precharging, whereas in the row erase mode all of the erase lines, one for each column of words, are coupled to erase signal $EE_{HV}$. Consequently, all word locations of the enabled row are erased to the logical one state.

The EEPROM 10 will operate within the array erase mode when $\overline{E}$ is low, $\overline{G}$ is higher than a normal logic high, $\overline{W}$ is low, $V_{PP}$ is in the program state, and CT1 is low or floating. In this mode, all of the rows are enabled in the same manner as in the column erase mode and all of the columns are selected in the same manner as in the row erase mode. In particular, both the column control signal $C_C$ and the row control signal $C_R$ are generated by control logic 20, as is erase signal $EE_{HV}$. With all of the columns of words selected and all of the rows enabled, erase signal $EE_{HV}$ is simultaneously coupled to all of the cells in cell array 36, thereby erasing entire cell array 36 to the logical one state.

The EEPROM 10 will operate in the bulk zero mode when $\overline{E}$ is low, $\overline{G}$ is high, $\overline{W}$ is low, $V_{PP}$ is in the program state, CT1 is high, and the data signals $D_0$–$D_7$ are all low. In this mode, all of the rows and columns of words are enabled in the same manner as in the array erase mode. In addition, control logic 20 asserts program enable signal PE to enable data buffer 42. With all rows enabled, all columns of words selected, the data input buffer 42 enabled, and data signals $D_0$–$D_7$ all low, a logic zero is programmed into every cell in cell array 36.

X buffer and array divider 22, in addition to buffering row address signals $A_{10}$ and $A_{11}$, can be used to reduce the number of word locations which are accessible to a user by one half or one fourth. A normal characteristic of decoders which receive binary address signals is that each individual address signal received causes narrowing of selection of a word location by one half, i.e., each logic state of each individual address signal corresponds to half of an array. Accordingly, providing an address signal, such as row address signal $A_{11}$, at a permanently selected logic state will cuase only half of the word locations in cell array 36 to be accessible. By providing another address signal, such as row address signal $A_{10}$, at a permanently selected logic state, a further one half reduction in accessible word locations will occur so that only one fourth of the word locations of cell array 36 will be accessible. Thus, for example, if it is determined during manufacture of EEPROM 10 that one or more bad cells exist in a particular portion of cell array 36, that portion can be rendered permanently inaccessible. The EEPROM 10 may then be marketed as a 16K or 8K unit, as appropriate.

In the preferred embodiment, the simultaneous application of row address signal $A_{11}$ at a selected logic state and an array divider signal of approximately fifteen volts to a probe pad 46, will force X buffer and array divider 22 to thereafter internally generate buffered row address $A_{11}$ in the selected logic state, in those modes in which a single row is selected. Accordingly, only a selected one half of cell array 36 will be accessible to a user. Similarly, the simultaneous application of row address signal $A_{10}$ at a selected logic state and the array divider signal to probe pad 48 will force X buffer and array divider 22 to thereafter internally generate buffered address $A_{10}$ in the selected logic state in those modes in which a single row is selected. Accordingly, only a selected one fourth of cell array 36 will be accessible to the user.

Figure 2:
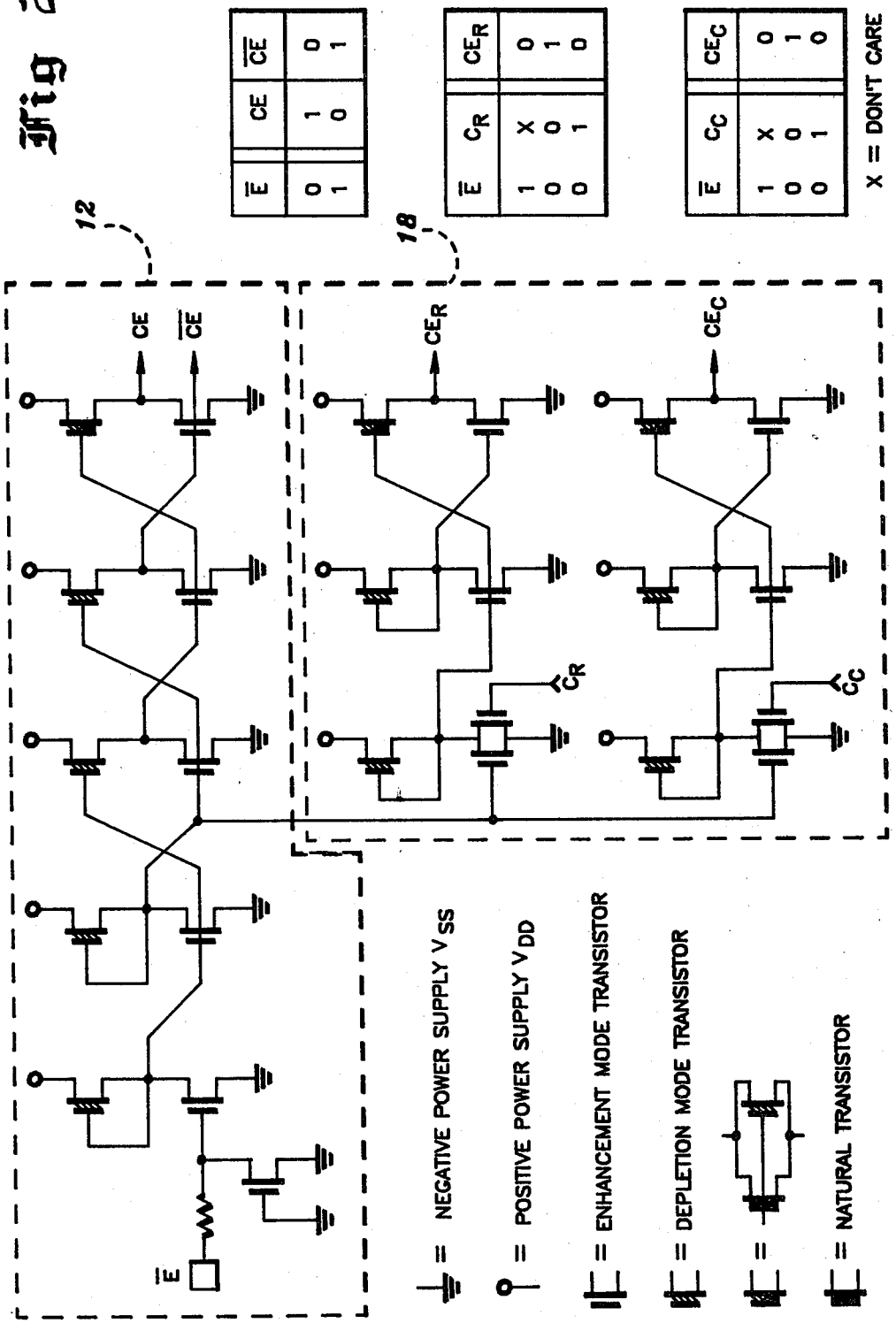
FIG. 2 is a schematic diagram of a buffer and signal generator.

Shown in FIG. 2 is chip enable buffer 12 and $CE_R/CE_C$ generator 18. Chip enable buffer 12 generates internal chip enable signals CE and $\overline{CE}$, with CE being the logical complement of the chip enable signal $\overline{E}$ and $\overline{CE}$ being the same logic state as chip enable signal $\overline{E}$. $CE_R/CE_C$ generator 18 generates row enable signal $CE_R$ and column enable signal $CE_C$ in a conventional manner in response to chip enable signal $\overline{E}$, and to row control signal $C_R$ and column control signal $C_C$ generated by control logic 20. In the tables which accompany the circuit diagrams to facilitate understanding the relationships between inputs and outputs, "1"s and "0"s represent normal logic highs and lows, respectively, whereas "HH" represents an input signal which has a voltage higher than that of a normal logic high "1" and "HV" represents a high voltge which is at least sufficient to program a cell.

Figure 3:
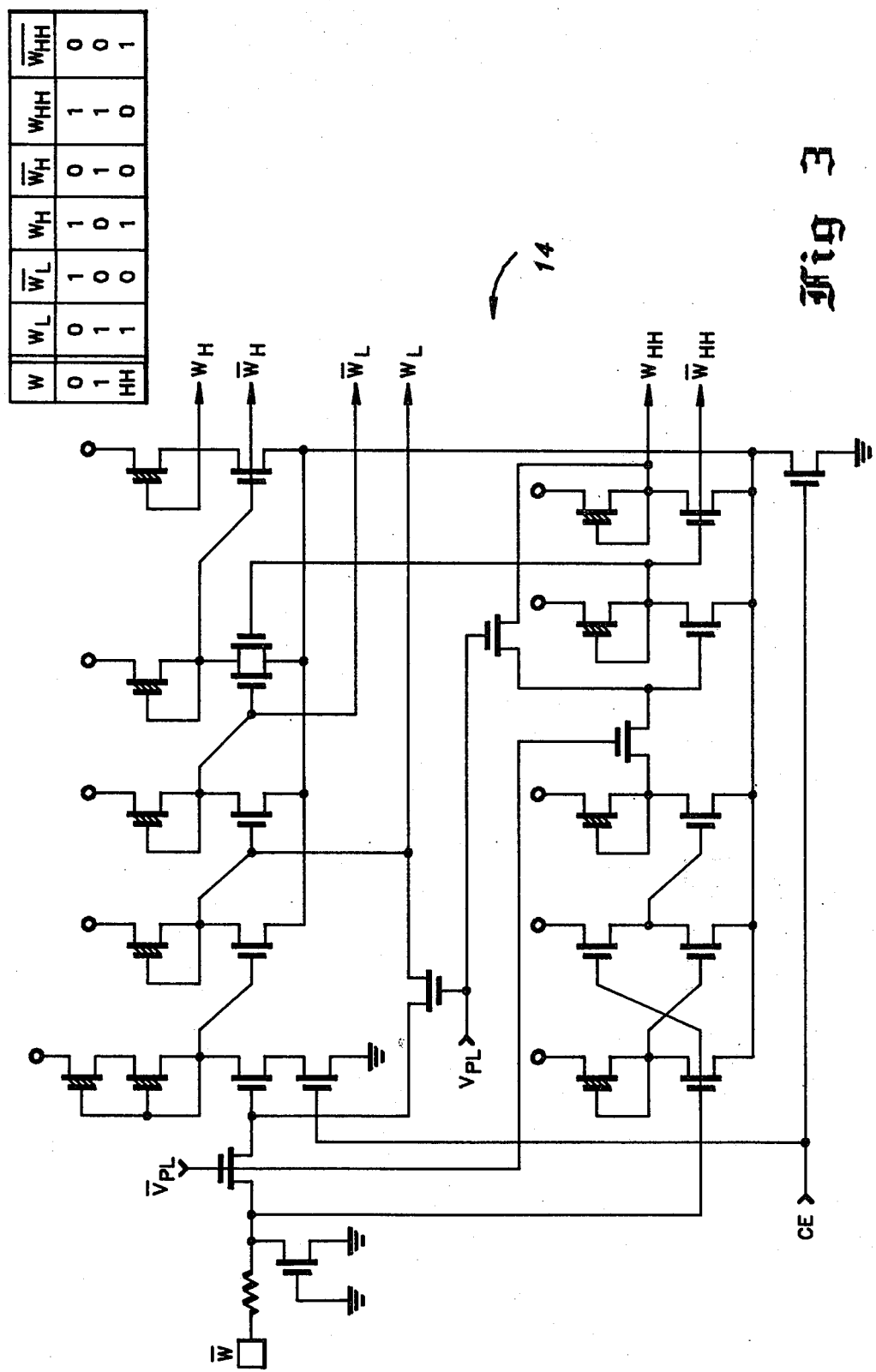
FIG. 3 is a schematic diagram of a write enable signal buffer and generator.

Shown in FIG. 3 is W buffer 14 which generates internal write enable signals $W_L$, $\overline{W_L}$, $W_H$, $\overline{W_H}$, $W_{HH}$, and $\overline{W_{HH}}$ in response to write enable signal $\overline{W}$ and internal chip enable signal CE. The higher than a normal logic high signal HH is differentiated from a normal logic high in a conventional manner, by adjusting channel length to width ratios of the respective input and load transistors. High voltage logic signals $V_{PL}$ and $\overline{V_{PL}}$ are used to enable a conventional latch so that the internal write enable signals can be held stable even if write enable signal $\overline{W}$ changes.

Figure 4:
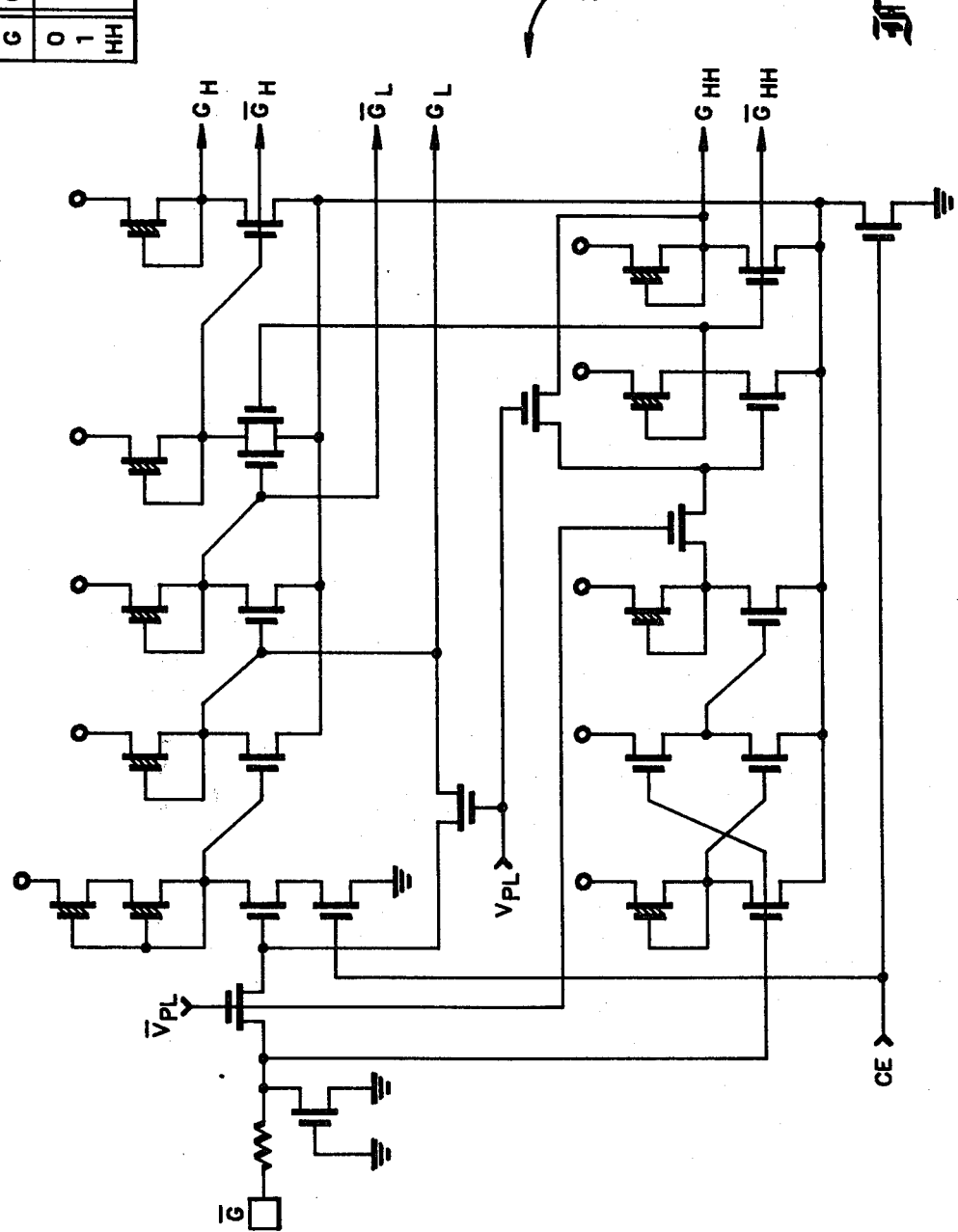
FIG. 4 is a schematic diagram of a chip select signal buffer and generator.

Shown in FIG. 4 is $\overline{G}$ buffer 16 which generates internal chip select signals $G_L$, $\overline{G_L}$, $G_M$, $\overline{G_M}$, $W_{HH}$, and $\overline{W_{HH}}$ in the same manner as the W buffer provides the write enable signals.

Figure 5:
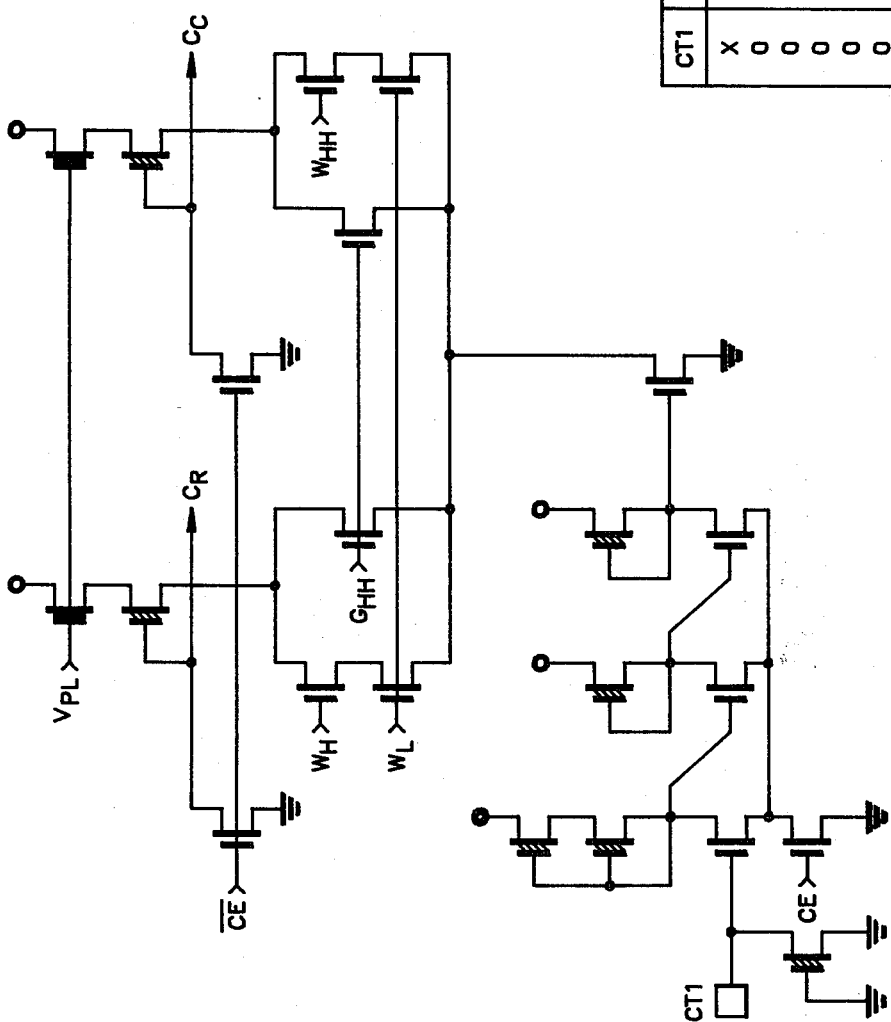
FIG. 5 is a schematic diagram of a row and column control signals generator.

Shown in FIG. 5 is a row control signal and column control signal ($C_R/C_C$) generator 510 which generates row control signal $C_R$ and column control signal $C_C$ in response to chip enable signals CE and $\overline{CE}$; internal write enable signals $W_L$, $W_H$, and $W_{HH}$; internal chip select signal $G_H$; bulk zero signal CT1; and high voltage logic signal $V_{PL}$. Row control signal $C_R$ is high during the array erase, bulk zero, and row erase modes. $C_R/C_C$ generator 510 is a portion of control logic 20 shown in FIG. 1.

Figure 6:
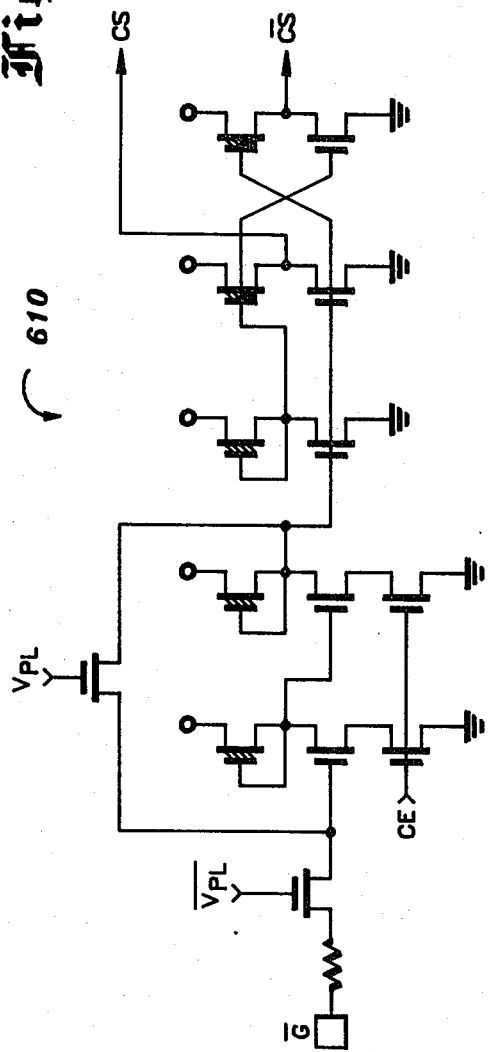
FIG. 6 is a schematic diagram of an output enable signal generator.

Shown in FIG. 6 is output enable generator 610 which generates output enable signals CS and $\overline{CS}$ in response to chip select signal $\overline{G}$ and internal chip enable signal CE. High voltage logic signal $V_{PL}$ is used to enable a conventional latch so that output enable signals CS and $\overline{CS}$ can be held stable with changes in chip select signal G. Output enable generator 610 is a portion of control logic 20 shown in FIG. 1.

Figure 7:
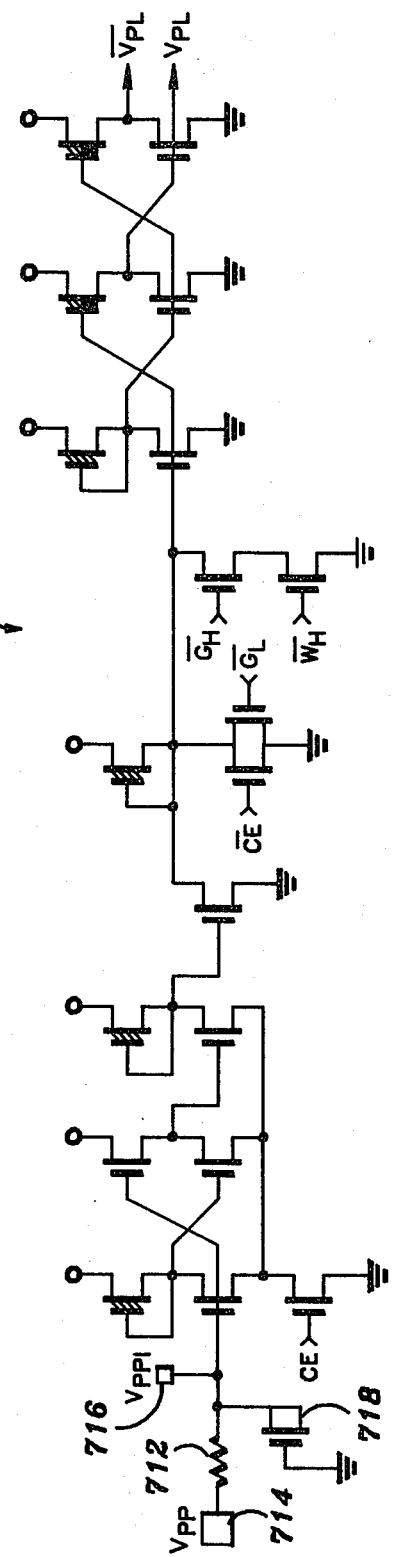
FIG. 7 is a schematic diagram of a high voltage logic signal generator.

Shown in FIG. 7 is high voltage logic signal ($V_{PL}$) generator 710 which generates high voltage logic signals $V_{PL}$ and $\overline{V_{PL}}$ in response to high voltage signal $V_{PP}$, internal chip enable signals CE and $\overline{CE}$, internal chip select signals $\overline{G_L}$ and $G_H$, and internal write enable signal $\overline{W_H}$. Internal high voltage supply $V_{PPI}$ is also provided via a current limiting resistor 712 which is connected between a high voltage signal terminal 714 and an internal high voltage supply terminal 716. Voltage protection for the circuitry of the EEPROM 10 is provided by an IGFET 718 having the gate thereof connected to ground and the drain and source thereof connected to high voltage supply terminal 716. High voltage logic signal $V_{PL}$ is high during the word program, bulk zero program, row erase, column erase, first and second word erase, and array erase modes. High voltage logic signal generator 710 is a portion of control logic 20 of FIG. 1.

Figure 8:
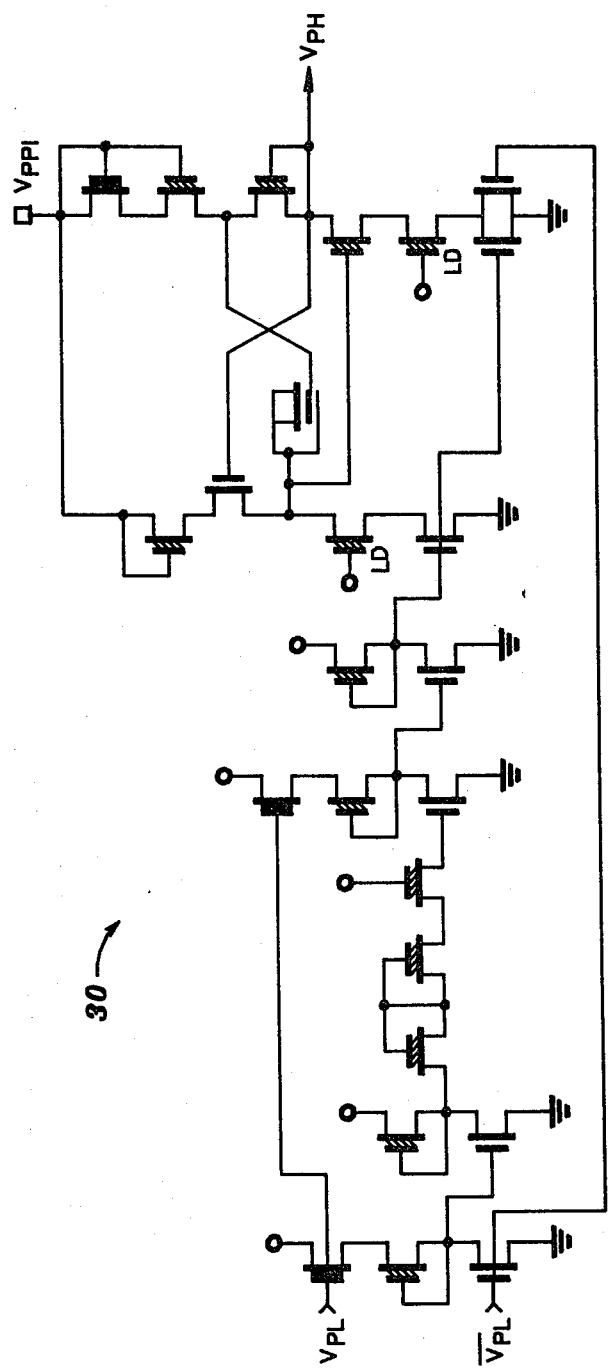
FIG. 8 is a schematic diagram of a high voltage control signal generator.

Shown in FIG. 8 is $V_{PH}$ generator 30 which generates high voltage control signal $V_{PH}$ in response to high voltage logic signals $V_{PL}$ and $\overline{V_{PL}}$. High voltage control signal $V_{PH}$ is capacitively boosted several volts above internal high voltage supply $V_{PPI}$ when $V_{PL}$ is high. High voltage control signal $V_{PH}$ is low when high voltage logic signal $V_{PL}$ is low.

Figure 9:
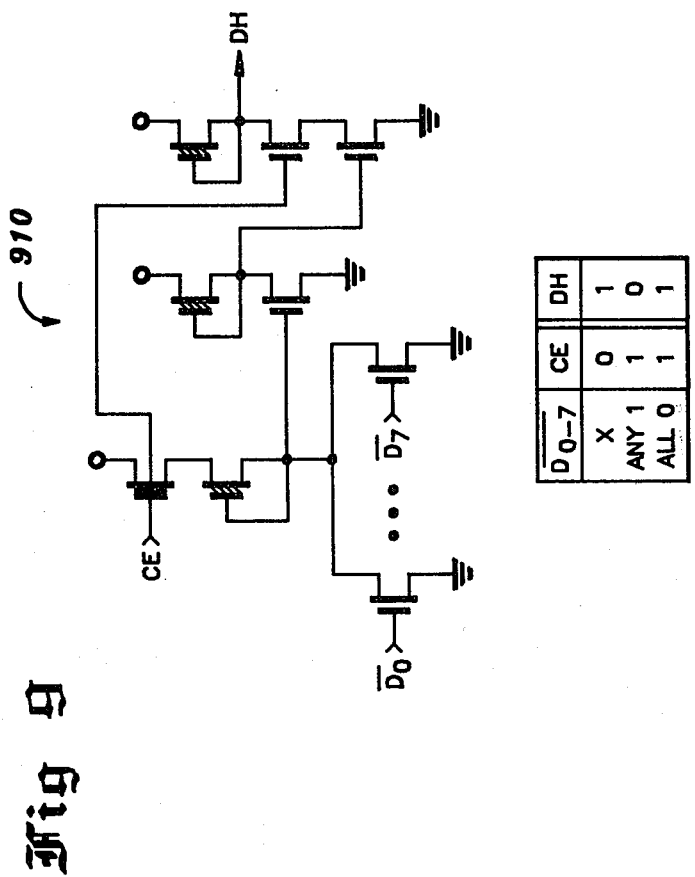
FIG. 9 is a schematic diagram of a data high signal generator.

Shown in FIG. 9 is a data high signal generator 910 which generates a data high signal DH in response to inverted data signals $\overline{D_0}$-$\overline{D_7}$ and internal chip enable signal CE. Data high signal DH is high when all data signals $D_0$-$D_7$ are high. Data high signal generator 910 is a portion of control logic 20 of FIG. 1.

Figure 10:
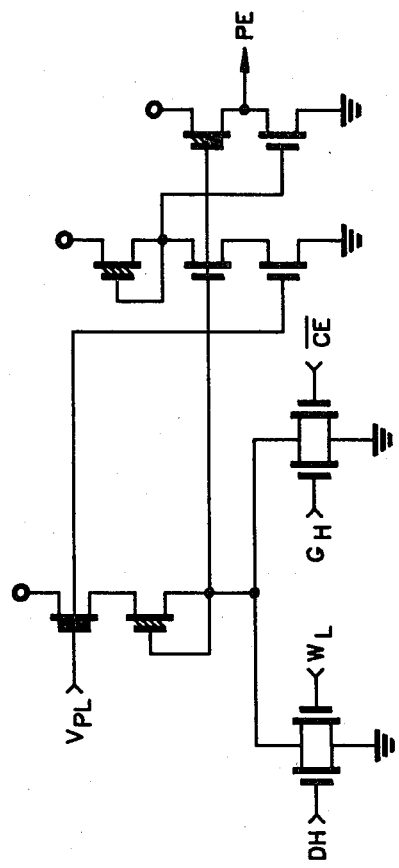
FIG. 10 is a schematic diagram of a program enable signal generator.

Shown in FIG. 10 is a program enable signal generator 1010 which generates program enable signal PE in response to data high signal DH, internal write enable signal $W_L$, internal chip select signal $G_H$, internal chip enable signal $\overline{CE}$, and high voltage logic signal $V_{PL}$. Program enable signal PE is high during the first word program and bulk zero program modes.

Figure 11:
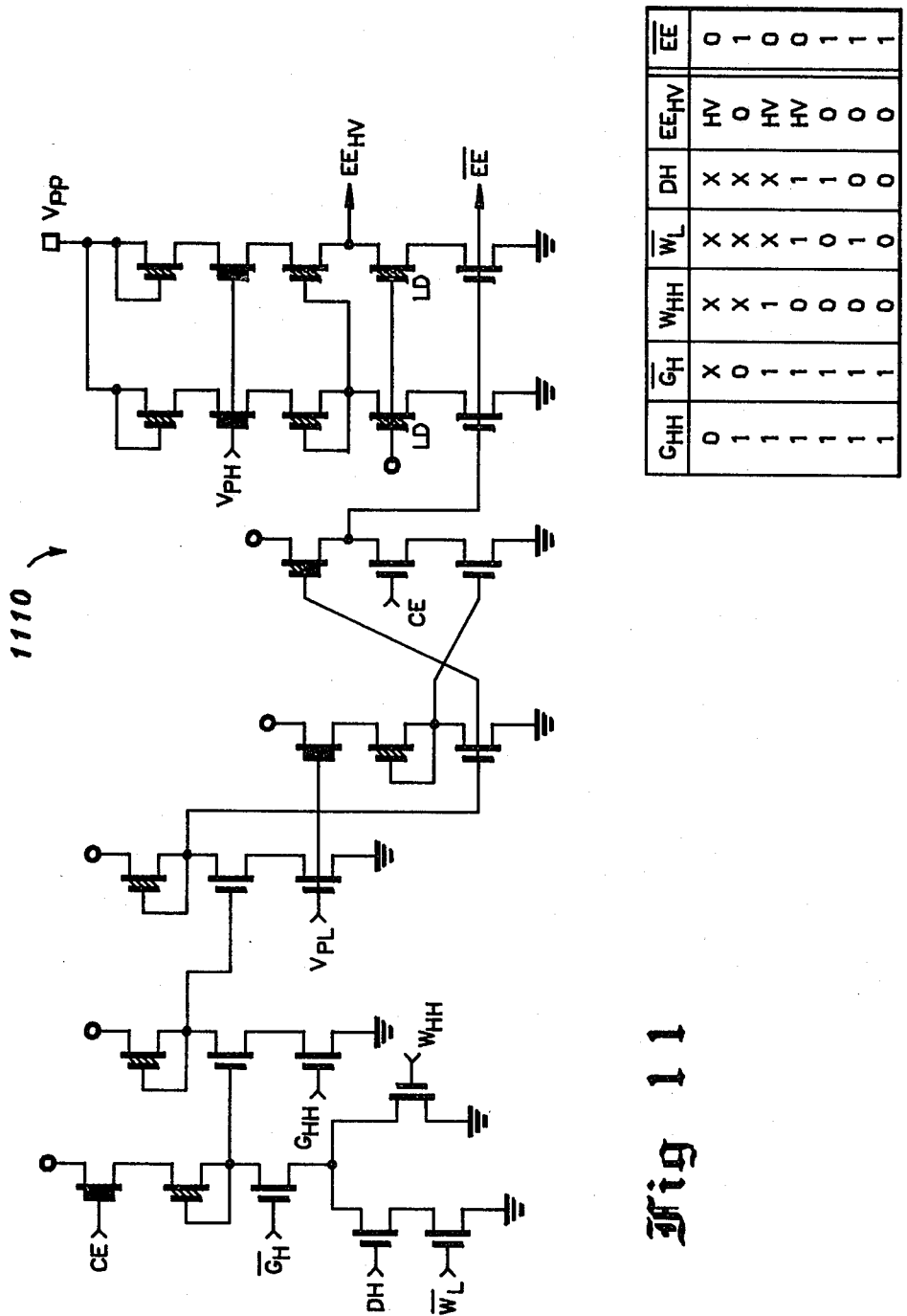
FIG. 11 is a schematic diagram of an erase signal generator.

Shown in FIG. 11 is an erase signal generator 1110 which provides erase signals $EE_{HV}$ and $\overline{EE}$ in response to internal chip enable signal CE; internal chip select signals $\overline{G_H}$ and $G_{HH}$; data high signal DH; write enable signals $\overline{W_L}$, $W_{HH}$; high control signal $V_{PH}$; and high voltage logic signal $V_{PL}$. Erase signal $EE_{HV}$ is at a voltage which is only a neglible amount below the voltage of internal high voltage supply $V_{PPI}$ during the first and second word erase, row erase, column erase, and array erase modes. Erase signal generator 1110 is a portion of control logic 20 of FIG. 1.

Figure 12:
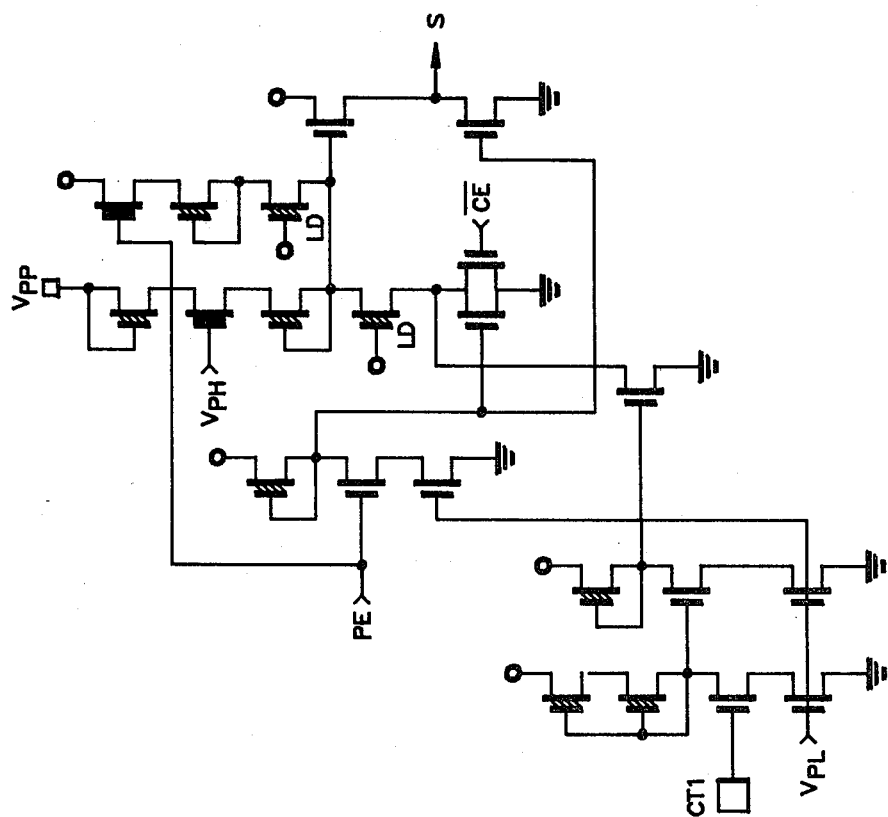
FIG. 12 is a schematic diagram of a source voltage generator.

Shown in FIG. 12 is a source voltage generator 1210 which generates source voltage S in response to bulk zero signal CT1, program enable signal PE, high voltage logic signal $V_{PL}$, high voltage control signal $V_{PH}$, and internal chip enable $\overline{CE}$. Source voltage S is at a voltage only a negligible amount above ground during the standby, read, first and second word erase, row erase, column erase, and array erase modes. Source voltage S is at a voltage only a negligible amount below the voltage of positive power supply $V_{DD}$ during the word program mode. Source voltage S is at a high impedance during the bulk zero program mode.

Figure 13:
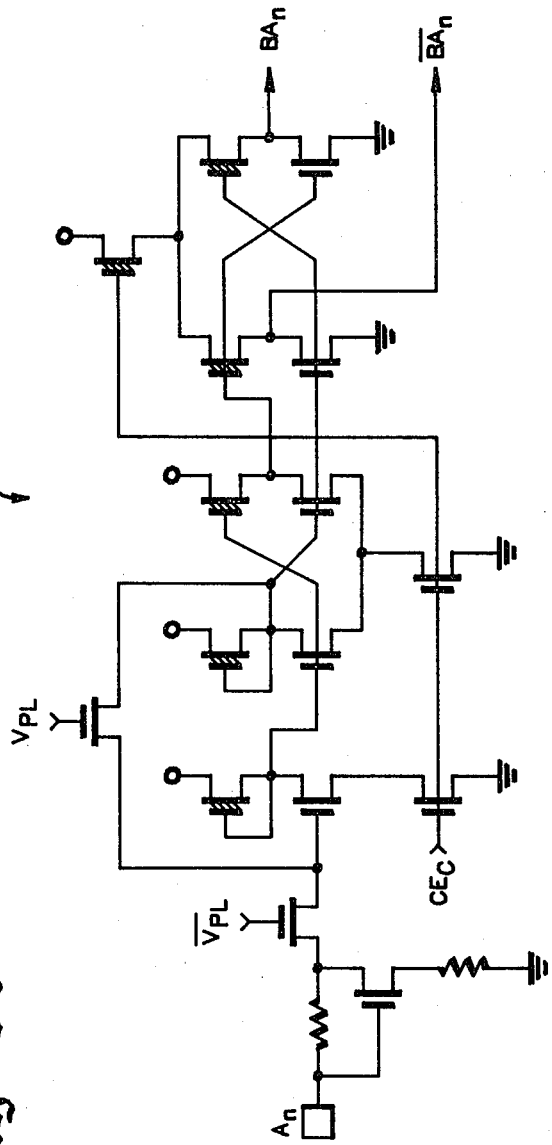
FIG. 13 is a schematic diagram of a column address buffer.

Shown in FIG. 13 is a typical column address buffer circuit 1310 which generates buffered column address signals $BA_n$ and $\overline{BA_n}$ in response to a column address signal $A_N$ and column enable signal $CE_C$. When column enable signal $CE_C$ is low, both buffered column enable signals $BA_n$ and $\overline{BA_N}$ are also low. When column enable signal $CE_C$ is high, buffered column address signal $B_{An}$ is the same logic state as that of column address signal An and buffered column address $\overline{BA_n}$ is the opposite logic state of that of column address signal $A_n$. High voltage logic signals $V_{PL}$ and $\overline{V_{PL}}$ enable a conventional latch so that the buffered column address signals can be held stable even if column address signal $A_n$ changes. Y buffer 26 of FIG. 1 comprises 4 column address buffer circuits 1310 which provide buffered column address signals $BA_{0-3}$ and $\overline{BA_{0-3}}$ in response to column address signals $A_{0-3}$.

Figure 14:
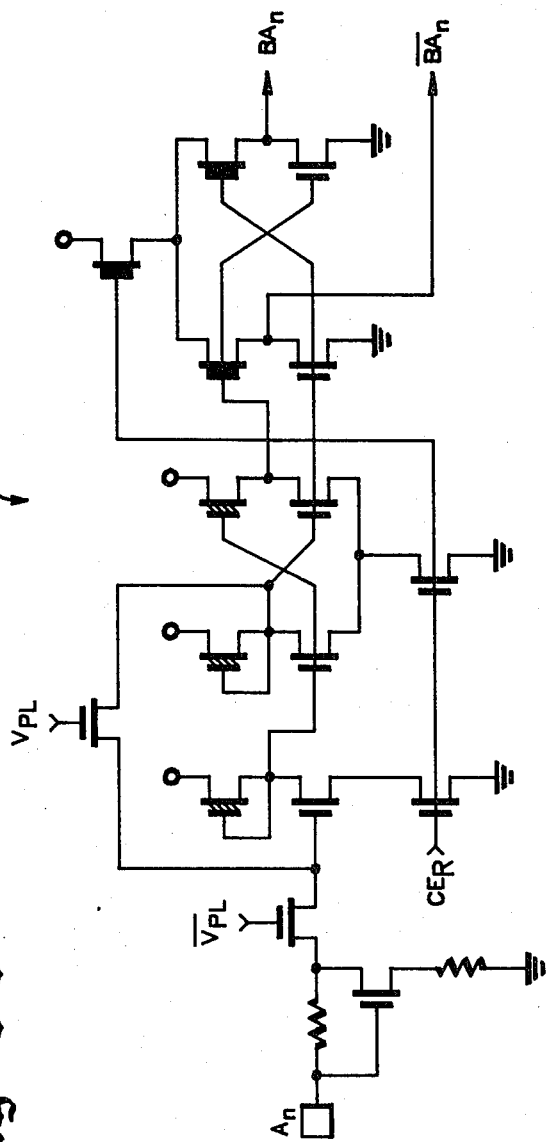
FIG. 14 is a schematic diagram of a row address buffer.

Shown in FIG. 14 is a typical row address buffer circuit 1410 which is substantially the same circuit as column address buffer circuit 1310 of FIG. 13. X buffer 24 of FIG. 1 comprises 5 row address buffer circuits 1410 which provide buffered row address signal $BA_{5-9}$ and $\overline{BA_{5-9}}$ in response to row address signals $A_{5-9}$ and row enable signal $CE_R$ in the manner described for Y buffer 26 of FIG. 1.

Figure 15:
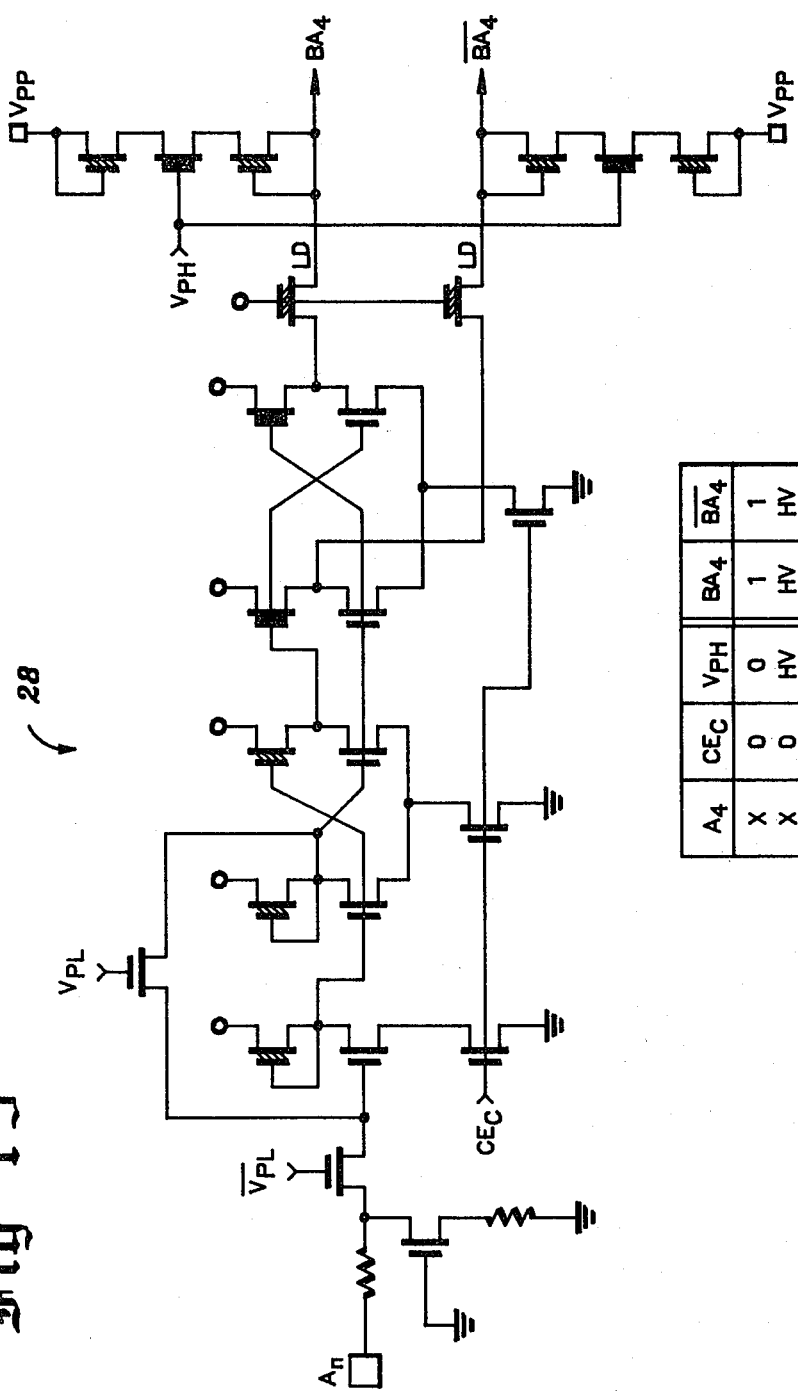
FIG. 15 is a schematic diagram of an array section select buffer and generator.

Shown in FIG. 15 is array section select buffer 28 of FIG. 1 which generates buffered signals $BA_4$ and $\overline{B_{A4}}$ in response to column address signal $A_4$ and column enable signal $CE_C$. One of $BA_4$ and $\overline{BA_4}$ is selectively provided at a voltage level which is only a negligible amound below the voltage of internal high voltage supply $V_{PPI}$ during the first and second erase, word program, and column erase modes. In response to column enable signal $CE_C$ being low, both buffered $A_4$ signals $BA_4$ and $\overline{BA_4}$ are at the voltage level which is only a negligible amount below the voltage of internal power supply $V_{PPI}$ during row erase, array erase, and bulk zero modes, and are at a logic high during standby mode. One of buffered $A_4$ signals $BA_4$ and $\overline{BA_4}$ is selectively high with the other low during the read mode. High voltage logic signals $V_{PL}$ and $\overline{V_{PL}}$ enable a conventional latch so that the buffered $A_4$ signals can be held stable with changes of column address signal $A_4$.

Figure 16:
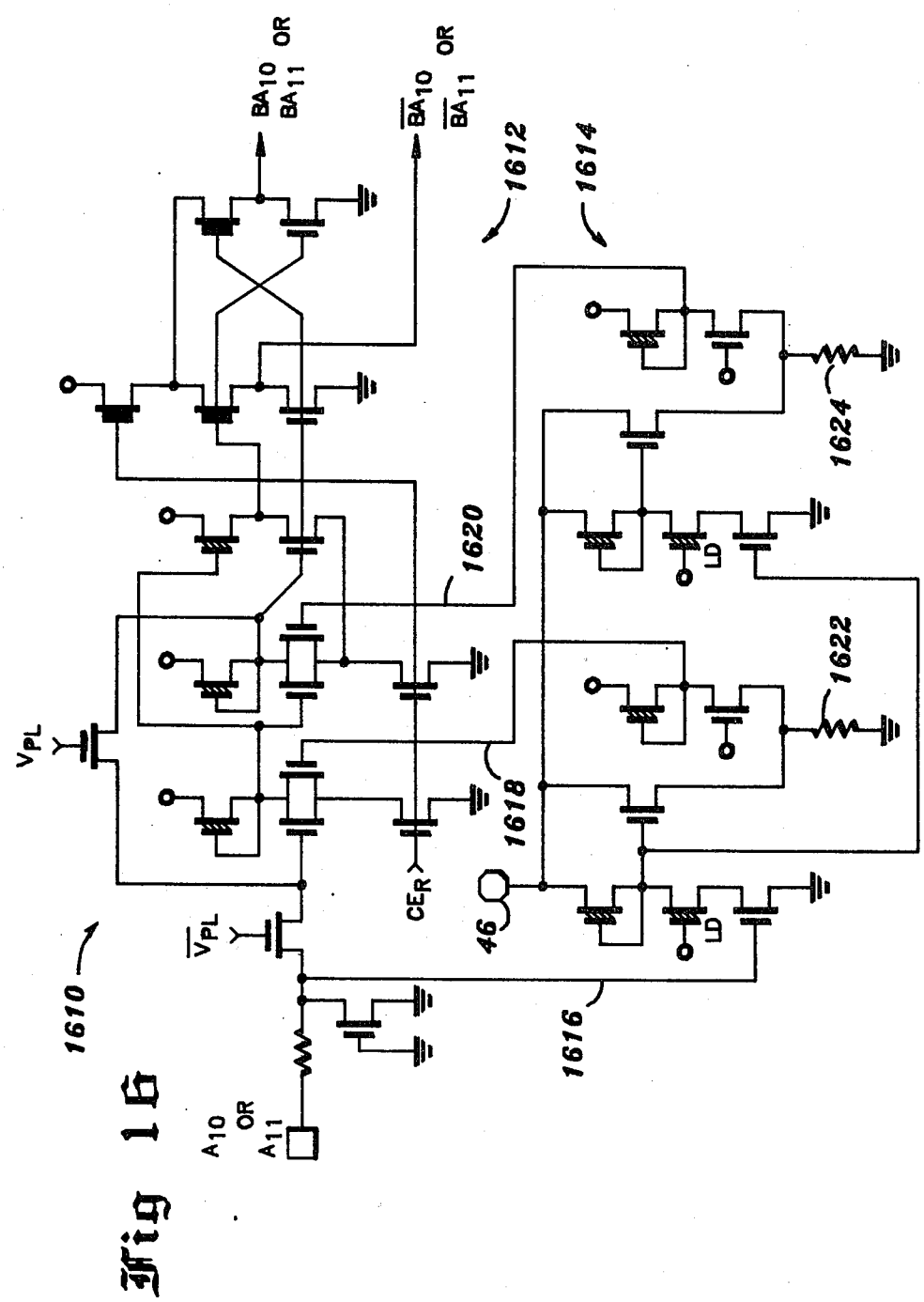
FIG. 16 is a schematic diagram of a programmable address buffer.

Shown in FIG. 16 is a buffer and array divider circuit 1610 which generates, in the absence of being programmed, a buffered address signal output in the same manner as column address buffer 1410 of FIG. 14. Buffer and array divider circuit 1610 is depicted with row address signal $A_{11}$ as an input with buffered row address signals $BA_{11}$ and $\overline{BA_{11}}$ as outputs. Buffer and array divider circuit 1610, along with a similar programmable buffer circuit which provides buffered row address signals $BA_{10}$ and $\overline{BA}_{10}$ in response to row address signal $A_{10}$, comprise X buffer and array divider 22 of FIG. 1. Buffer and array divider circuit 1610 is comprised generally of a buffer section 1612 and a programmable divider section 1614. Programmable divider section 1614 is coupled to buffer section 1612 by lines 1616, 1618, and 1620. In the absence of being programmed, programmable divider section 1614 will hold lines 1618 and 1620 to a logic low resulting in buffer and array divider circuit 1610 operating in the same manner as column address buffer 1410 of FIG. 14. If line 1618 is programmed to be a logic high, with line 1620 remaining low, buffered row address signal $\overline{BA}_{11}$ will be held to a logic low and buffered row address signal $BA_{11}$ will be held to a logic high except when row enable signal $CE_R$ is low. If line 1620 is programmed to be a logic high, with line 1618 remaining a logic low, buffered column address signal $\overline{BA}_{11}$ will be held to a logic low and buffered column address $BA_{11}$ will be at a logic high except when row enable signal $CE_R$ is a logic low in which case both buffered column address signals $BA_{11}$ and $\overline{BA}_{11}$ will be a logic low. Line 1618 is programmed to be a logic high by applying a logic low on line 1616 and applying the array divider signal of approximately 15 volts to probe pad 46. The array divider signal is coupled to a polysilicon fuse 1622 which is consequently caused to be an open circuit. With polysilicon fuse 1622 an open circuit, line 1618 will always be a logic high. Consequently, so long as row enable signal $CE_R$ is a logic high, buffered row address signal $BA_{11}$ will be a logic high and buffered row address signal $\overline{BA}_{11}$ will be a logic low. Line 1620 is programmed to be a logic high by applying a high on line 1616 and applying the array divider signal to probe pad 46. The array divider signal is then coupled to a polysilicon resistor 1624 which is consequently caused to be an open circuit. With polysilicon fuse 1624 an open circuit, line 1620 will always be a logic high. Consequently, so long as row enable signal $CE_R$ is a logic high, buffered row address signal $BA_{11}$ will be a logic low and buffered row address signal $\overline{BA}_{11}$ will be a logic high. Row enable signal $CE_R$ is a logic high in those modes in which a single row is to be selected. The buffer and array divider circuit for row address signal $A_{10}$ is programmed in the same way.

Figure 17:
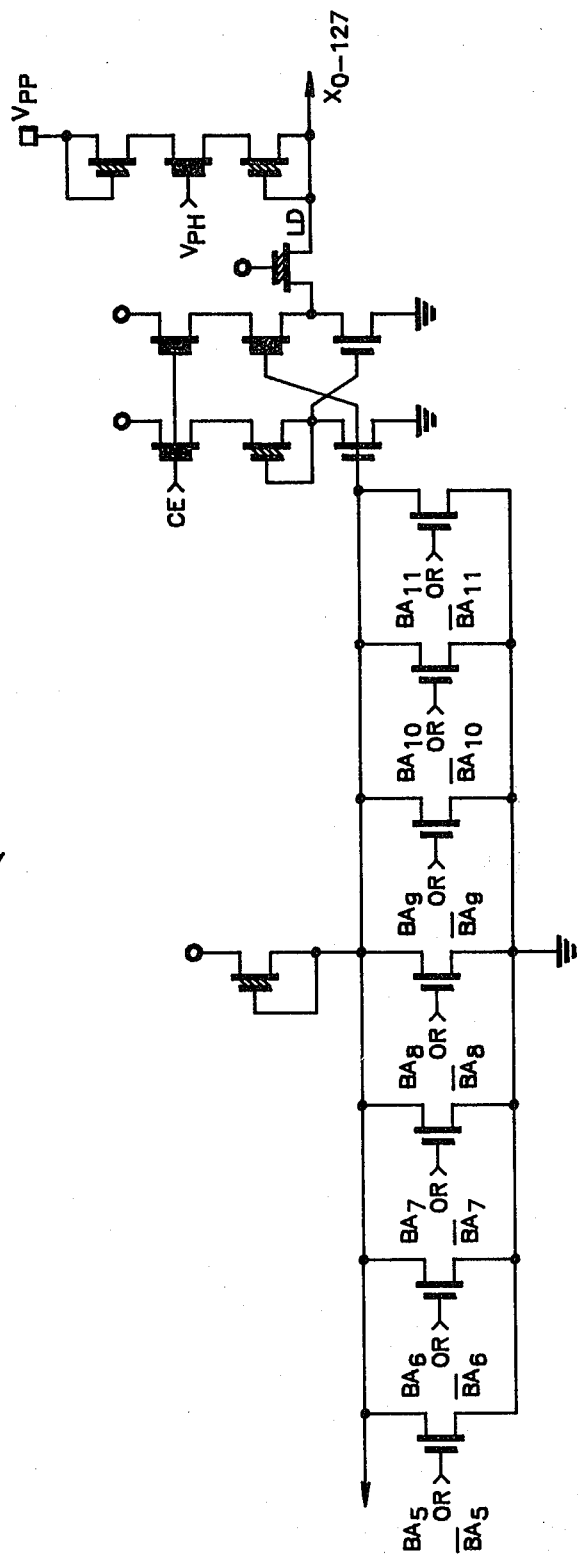
FIG. 17 is a schematic diagram of a row decoder.

Shown in FIG. 17 is a row decoder circuit 1710, which generates a row decoder signal X in response to a unique combination of bufferd new address signals $BA_{5-11}$ or $\overline{BA}_{5-11}$. X decoder 32 of FIG. 1 comprises 128 row decoder circuits 1710, one for each row. A particular row address circuit 1710 is selected when all the inputs thereto are low. When selected, the row decoder circuit 1710 provides a respective row decoder signal X at a logic high during the read mode and at a voltage which is only a negligible amount below the voltage of internal high voltage supply $V_{PPI}$ during the word program, bulk zero, first and second word erase, column erase, row erase and array erase modes. In the modes when row enable signal $CE_R$ is low, all buffered row address signals are low which in turn selects all of the row address circuits of X decoder 32, thereby enabling all of the rows.

Figure 18:
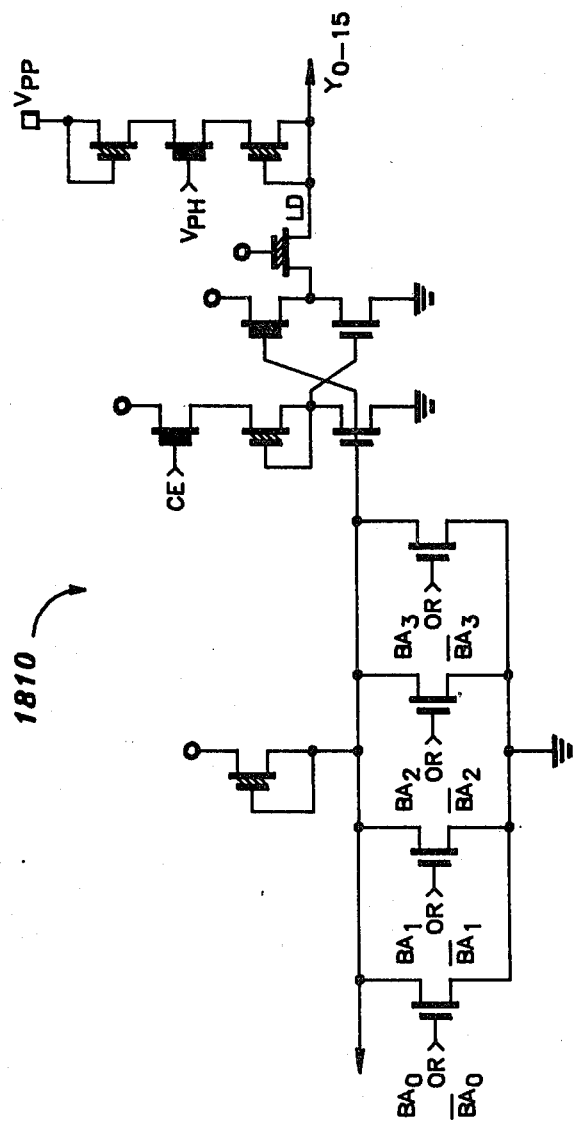
FIG. 18 is a schematic diagram of a column decoder.

Shown in FIG. 18 is a column decoder circuit 1810 which generates a column decoder signal $Y_{0-15}$ in response to a unique combination of buffered column address signals $BA_{0-3}$ or $\overline{BA}_{0-3}$. Y decoder 34 of FIG. 1 comprises 16 column decoder circuits 1810. Column decoder circuit 1810 operates the same as row decoder circuit 1710 except each column decoder circuit 1810 selects two columns of words whereas each row decoder circuit 1710 enables only a single row. A selected column decoder circuit 1810 causes Y gate 38 of FIG. 1 to couple two columns of words to array section gate 40. In the modes when column enable signal $CE_C$ is a logic low, all buffered column address signals are a logic low thereby selecting all column decoder circuits of Y decoder 34 of FIG. 1.

Figure 19:
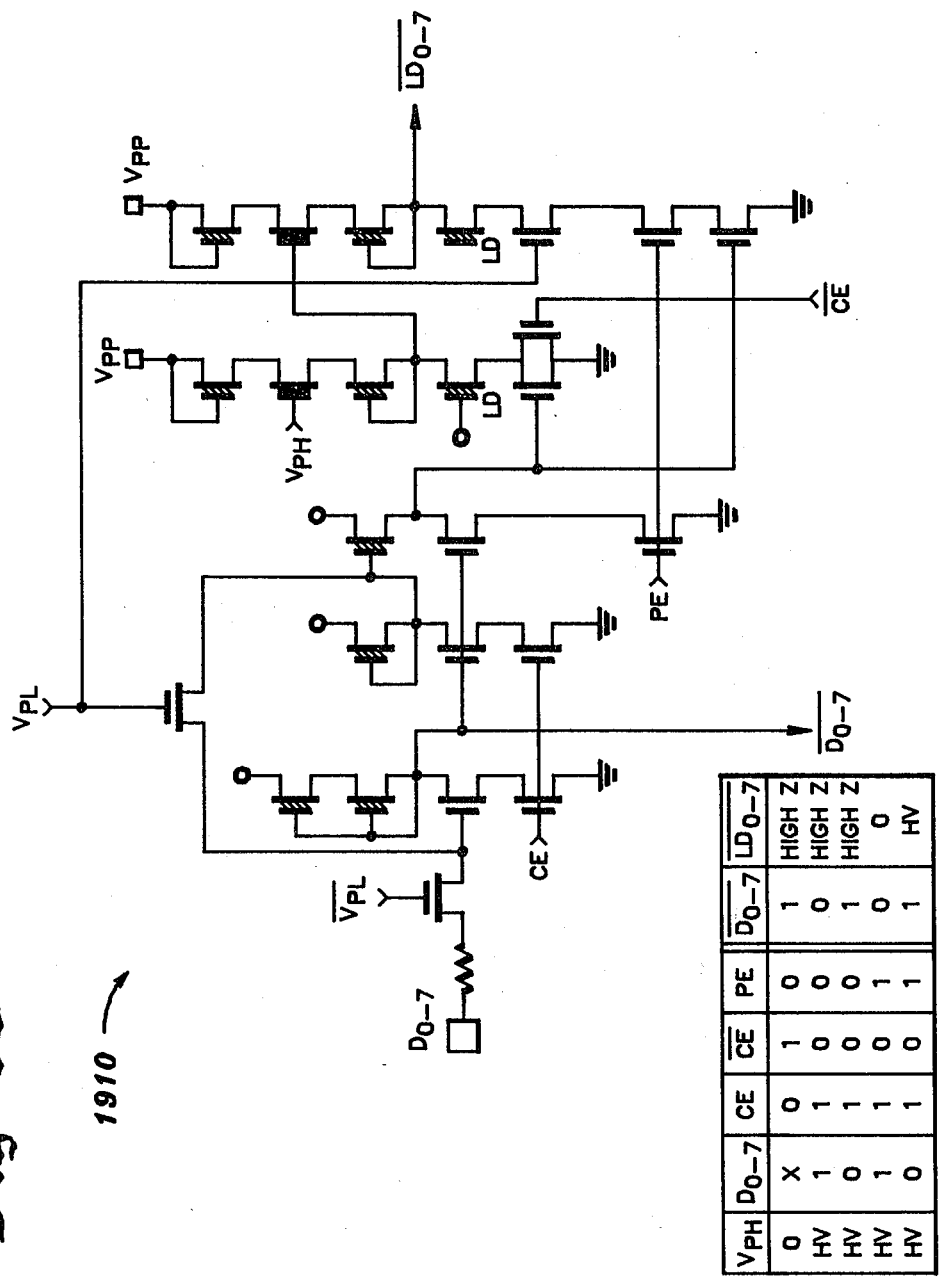
FIG. 19 is a schematic diagram of level-shifted data signal generator.

Shown in FIG. 19 is a data input buffer circuit 1910 which generates a level-shifted data signal $\overline{LD_{0-7}}$ in response to a corresponding data signal $D_{0-7}$. Data input buffer 42 comprises 8 data input buffer circuits 1910. The level-shifted data signal $L_{D0-7}$ is, in the word program and bulk zero modes, inverted and level-shifted to be approximately zero volts in response to a logic high, and at a voltage which is only a negligible amount below the voltage of internal high voltage supply $V_{PPI}$ in response to a logic low. A high impedance is provided in the other modes. In addition, inverted data signals $\overline{D_{0-7}}$ are provided in response to data signals $D_{0-7}$. High voltage logic signals $V_{PL}$ and $\overline{V_{PL}}$ enable a conventional latch so that level-shifted data signals $LD_{0-7}$ and inverted data signals $\overline{LD_{0-7}}$ can be held stable with changes in data signals $D_{0-7}$.

Figure 20:
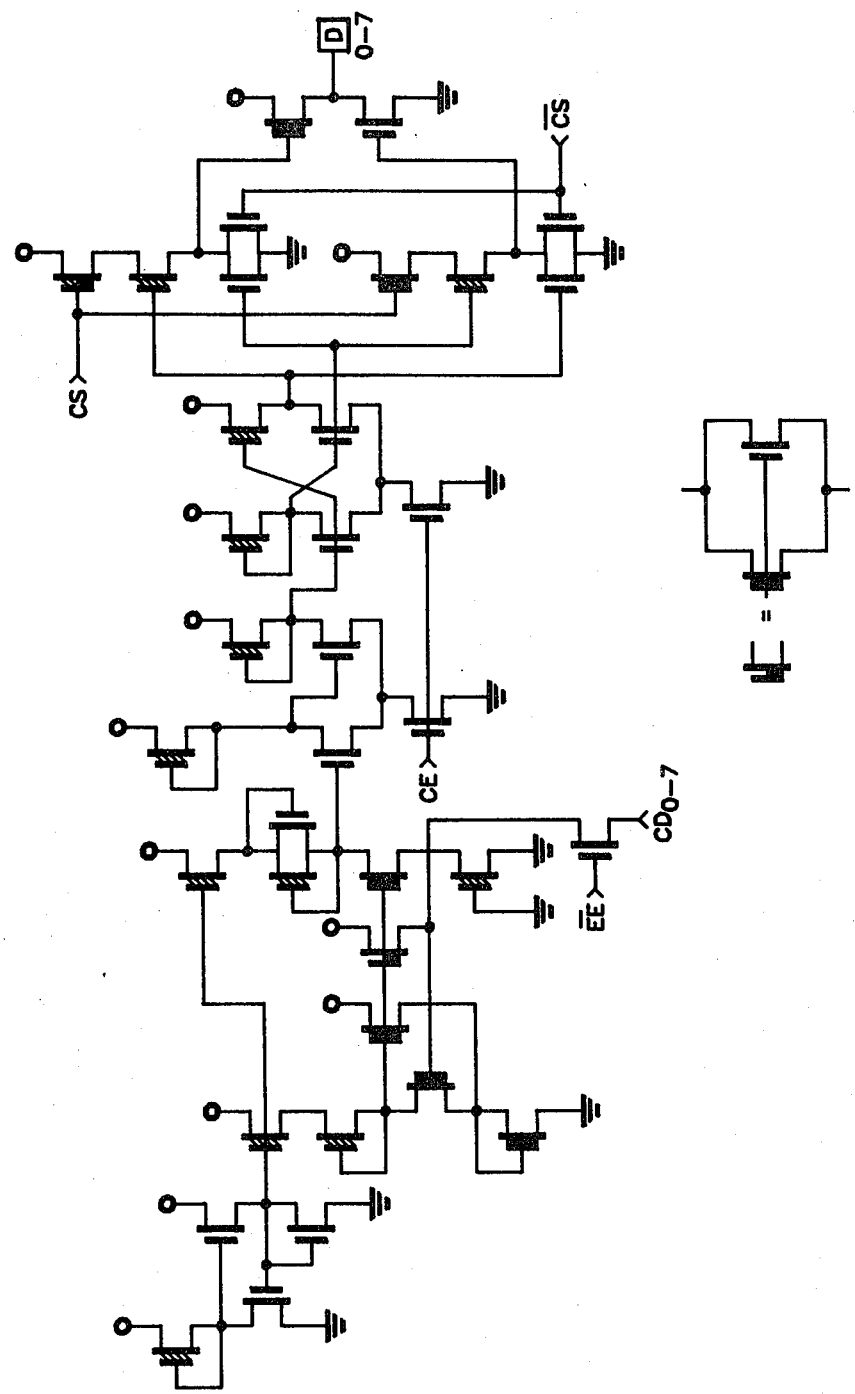
FIG. 20 is a schematic diagram of a sense amplifier.

Shown in FIG. 20 is a sense amplifier circuit 2010 for generating a data signal $D_{0-7}$ in response to an accessed cell input $CD_{0-7}$. Sense amplifier 44 of FIG. 1 comprises 8 sense amplifier circuits 2010. Output enable signals CS and $\overline{CS}$ enable sense amplifier circuits 2010 to generate data signals $D_{0-7}$ during the read mode only. A high impedance is provided during other modes to prevent sense amplifier 44 of FIG. 1 from interfering with data input buffer 42 of FIG. 1.

Figure 21:
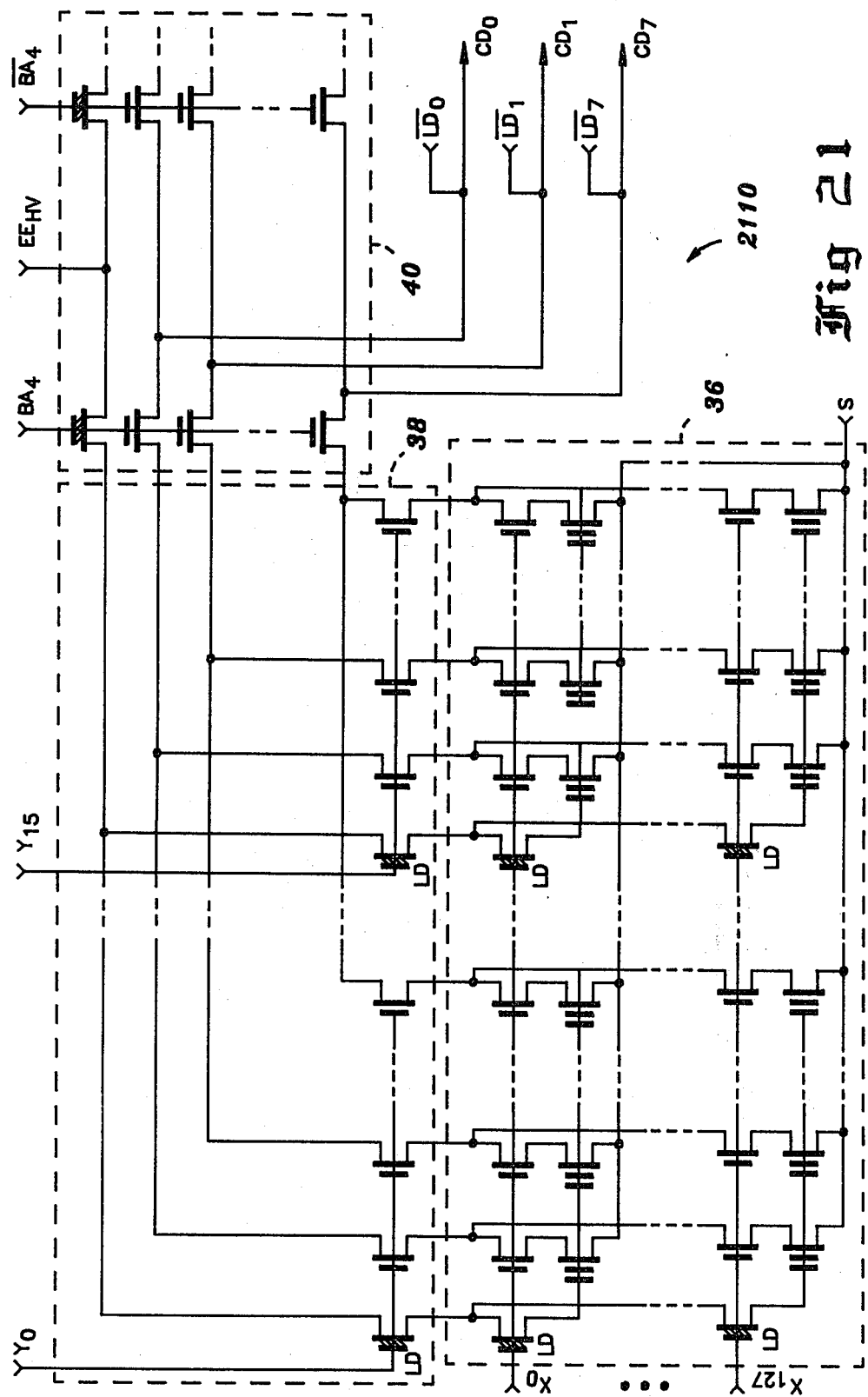
FIG. 21 is a schematic diagram of an array structure.

Shown in FIG. 21 is array organization structure 2110 comprising a portion of cell array 36, a portion of array section gate 38, and a portion of Y gate 40. Portions of word locations $X_0Y_0$, $X_{127}Y_0$, $X_0Y_{15}$, and $X_{127}Y_{15}$ are shown. These word locations are from the section of cell array 36 which is selected by buffered $A_4$ signal $\overline{BA_4}$. The cells at the word locations can be conventional floating gate insulated gate field effect transistors having selectable threshold voltages, for example approximately 5.0 volts in an erased or logical one state and approximately $-5.0$ volts in a programmed or logical zero state. In the standby mode, all row decoder signals $X_{0-127}$ are at a logic low, all column decoder signals are at a logic high, and buffered $A_4$ signals $BA_4$ and $\overline{BA_4}$ at a logic high. Consequently, no rows are enabled whereas all columns are coupled to sense amplifier 44 of FIG. 1 to be precharged. In the read mode, a word location to be accessed is selected by a particular row decoder signal among row decoder signals $X_{0-127}$ being at a logic high, a particular column decoder signal among column decoder signals $X_{0-15}$ being at a logic high, and one of buffered $A_4$ signals $BA_4$ and $\overline{BA_4}$ being at a logic high. Consequently, the eight cells of a single word location are coupled to sense amplifier 44 of FIG. 1 as accessed cell input $CD_{0-7}$. In the word program mode, a word location is selected in a similar manner to the read mode except the particular decoder and buffered $A_4$ signals are provided at a voltage which is only a negligible amount below the voltage of internal high voltage supply $V_{PPI}$ instead of at a logic high. Level-shifted data signals $LD_{0-7}$ are coupled to the cells of the selected word location for programming the selected word location. In the first and second word erase modes, a word location is selected in the same manner as in the word program mode. Erase signal $EE_{HV}$ at a high voltage is coupled to the gates of the cells of the selected word location for erasing the selected word location. In the array erase mode all decoder and buffered $A_4$ signals are provided at a voltage which is only a negligible amount below the voltage of internal supply voltage $V_{PPI}$ so that all word locations are selected. Erase signal $EE_{HV}$ at a high voltage is coupled to the gates of the cells of all word locations for erasing all of the word locations. In the bulk zero mode all word locations are selected in the same way as in the array erase mode. A program signal is applied to all word locations from data input buffer 42 as level-shifted data signals $LD_{0-7}$ being at a voltage which is only a negligible amount below the voltage of internal supply voltage $V_{PPI}$. Consequently the cells of all word locations are programmed to a logic low. In the row erase mode all columns are selected as in the array erase mode and a particular row is selected as in the first and second word erase modes. Erase signal $EE_{HV}$ is coupled to the gates of the cells of all word locations along the selected row for erasing the entire row. In the column erase mode all rows are selected as in the array erase mode and a single column is selected as in the first and second word erase modes. Erase signal $EE_{HV}$ is coupled to the gates of the cells of all word locations along the selected column for erasing the entire column.

While the invention has been described in a preferred embodiment it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. An electrically erasable programmable read only memory (EEPROM) comprising:
   an array of electrically erasable memory elements arranged with one of said memory elements at the intersection of each of a plurality of rows and columns of said array;
   logic means for generating, in response to a row erase mode signal, a row control signal at a first logic state and a column control signal at a second logic state;
   column select means for coupling, when the column control signal is at the second logic state, an erase signal to all of the columns of said array; and
   row decoder means for enabling, when the row control signal is at the first logic state, said erase signal to electrically erase the memory elements comprising the row of said array selected in response to a row address signal.

2. The EEPROM of claim 1 wherein the column select means comprises:
   a plurality of column address buffer means, each column address buffer means providing two buffered address signals, one true and one complementary, of an individual column address signal when the column control signal is at a first logic state, and providing both buffered address signals at a predetermined logic state when the column control signal is at said second logic state; and
   column decoder means for coupling said erase signal to all of the columns of said array in response to all of the buffered address signals of the plurality of column address means being at said predetermined logic state.

3. An electrically erasable programmable read only memory (EEPROM) comprising:
   an array of electrically erasable memory elements arranged with one of said memory elements at the intersection of each of a plurality of rows and columns of said array;
   logic means for generating in response to a column erase mode signal a column control signal at a first logic state and a row control signal at a second logic state;
   row select means for coupling, when the row control signal is at the second logic state, an erase signal to all of the rows of said array; and
   column decoder means for enabling, when the column control signal is at the first logic state, said erase signal to electrically erase the memory elements comprising the column of said array selected in response to a column address signal.

4. The EEPROM of claim 3 wherein the row select means comprises:
   a plurality of row address buffer means, each row address buffer means providing two buffered address signals, one true and one complementary, of an individual row address signal when the row control signal is at a first logic state, and providing both buffered address signals at a predetermined logic state when the row control signal is at said second logic state; and
   row decoder means for coupling said erase signal to all of the rows of said array in response to all of the buffered address signals of the plurality of row address means being at said predetermined logic state.

* * * * *